(12) United States Patent
Takei et al.

(10) Patent No.: US 7,617,469 B2
(45) Date of Patent: Nov. 10, 2009

(54) ASSERTION DESCRIPTION CONVERSION DEVICE, METHOD AND COMPUTER PROGRAM PRODUCT

(75) Inventors: Tsutomu Takei, Kanagawa-ken (JP); Hiroshi Imai, Saitama-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 53 days.

(21) Appl. No.: 11/842,317

(22) Filed: Aug. 21, 2007

(65) Prior Publication Data

US 2008/0059928 A1 Mar. 6, 2008

(30) Foreign Application Priority Data

Aug. 21, 2006 (JP) ............... 2006-224410

(51) Int. Cl.
*G06F 17/50* (2006.01)
(52) U.S. Cl. .............................. 716/5; 716/4
(58) Field of Classification Search .................. 716/4–6
See application file for complete search history.

(56) References Cited

U.S. PATENT DOCUMENTS

| | | | |
|---|---|---|---|
| 6,510,541 B1 * | 1/2003 | Fujiwara et al. ............... | 716/5 |
| 7,363,610 B2 * | 4/2008 | Alfieri ......................... | 716/18 |
| 7,409,670 B1 * | 8/2008 | Pritchard et al. ............... | 716/17 |
| 2004/0025127 A1 * | 2/2004 | Takenaka ...................... | 716/5 |
| 2005/0144581 A1 | 6/2005 | Imai | |
| 2007/0250303 A1 | 10/2007 | Imai et al. | |

OTHER PUBLICATIONS

Gajski et al, High-Level Synthesis, Introduction to Chip and System Design, Chapter 7.

* cited by examiner

*Primary Examiner*—Jack Chiang
*Assistant Examiner*—Binh C Tat
(74) *Attorney, Agent, or Firm*—Turocy & Watson, LLP

(57) ABSTRACT

An assertion description conversion device comprising: verification target identification unit parsing the syntax of a high-level assertion description described by a high-level assertion description language for verification of an inputted design description of a broader term to identify a verification target; design description searching unit searching a description on the verification target in a design description of a broader term; verification target description conversion unit converting the description of the verification target into a design description of a narrower term according to the design description of the narrower term corresponding to the description searched by the design description searching unit; verification content analysis unit for analyzing verification contents for the verification target described in the high-level assertion description; and verification content description conversion unit for converting the verification contents analyzed by the verification content analysis unit into the description format of a low-level assertion description language for verification of a design description of the narrower term.

14 Claims, 11 Drawing Sheets

```
．
．
if(wr==0) {
    if(ardy==0) {temp_a = addr.read();wait();
    drdy.write(1); data.write(mem[temp_a]); wait();}
    ．
    ．
```

FIG. 5

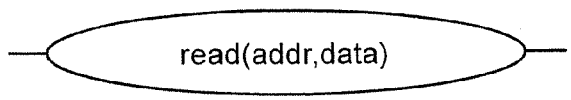
FIG. 6A
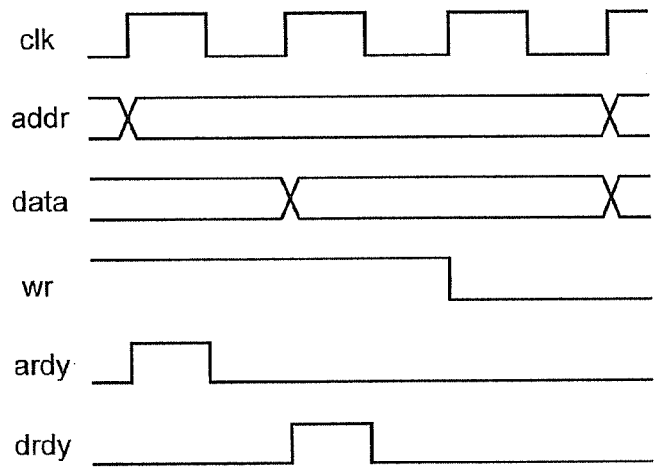
FIG. 6B
| TABLE FOR CORRESPONDENCE BETWEEN PORTS AND SIGNALS | | |
|---|---|---|
| TRANSACTION LEVEL | I/O CYCLE OPERATION LEVEL | |
| PORT NAME | DATA SIGNAL NAME | CONTROL SIGNAL NAME |
| addr | addr | ardy |
| data | data | drdy |
FIG. 6C

| CONTENT OF INFORMATION | INPUT | OUTPUT | VALUE |
|---|---|---|---|
| LATENCY | in_accept | out_ready | N CLOCK CYCLES |

| STATEMENT TABLE ||
| TYPE | CONTENT |
| --- | --- |
| CONDITION | in_accept == 1 |
| wait | |
| CONDITION | in_accept == 0 |
| wait | |
| assert | out_ready == 1 |

FIG. 14

$fell (in_accept |->##N (out_ready == 1);

FIG. 15

ASSERTION DESCRIPTION CONVERSION DEVICE, METHOD AND COMPUTER PROGRAM PRODUCT

CROSS-REFERENCE TO RELATED APPLICATIONS

This application is based upon and claims the benefit of priority from prior Japanese Patent Application No. 2006-224410, filed Aug. 21, 2006, the entire contents of which are incorporated herein by reference.

BACKGROUND OF THE INVENTION

1. Field of the Invention

The present invention relates to an assertion description conversion device, a method and a computer program product, and particularly to an assertion description conversion device and a method for converting an assertion description for verification of a design description of a broader term into an assertion description for verification of a design description of a narrower term.

2. Description of the Related Art

The scale of circuits mounted on an LSI has increased accompanying a recent increase in the integration density of LSIs. In response to the increase in the circuit scale, the efficiency of LSI design needs to be enhanced and the level of abstraction of an LSI is on the increase. In other words, broader-term design has been developed in the sense that the design has been progressing from a function-level design on a Resister Transfer Level (RTL) by the conventional description of a Hardware Description Language (HDL) to an operation-level design by the description of a base language of the C language, such as the SystemC. In this operation-level design, broader-term design has also been developed in the sense that the design has been progressing from an low-level I/O cycle operation description of clock synchronization to a high-level transaction level operation description.

In response to the increase of the level of abstraction at a design level, design verification has been made efficient, and various kinds of methods of design verification have been developed. One of such methods is an assertion verification method. In the assertion verification, an assertion description is created in which an assertion corresponds to each design level, that is, a "condition to be," is described, and whether a design description of each of the level violates the assertion is checked.

In order to create an assertion description corresponds to each design level, for a design description at an operation level, an assertion description is created using the SystemC, for example, and for a design description at a function level, an assertion description is created by the System Verilog Assertion (SVA), for example.

Thus, it is necessary to create one assertion description for a design description of every design level. When such an assertion description is created manually, it requires a lot, and errors tend to be involved. Further, when the design of a broader term is changed after the assertion description for the design description of a narrower term is created, a new assertion description for the design description of the narrower concept needs to be created, and consequently, the creation of assertion descriptions becomes inefficient. To solve these problems, an LSI design verification device has been proposed, which mechanically generates, for example, an assertion description for an RTL description (for example, refer to Japanese Patent Application Laid-open Publication No. 2005-108007 (pp. 10-11, FIG. 1)).

However, in the case of the above-mentioned LSI design verification device, there is a problem that it takes time to generate an assertion description for an RTL description. This is caused because, to create an assertion description for an RTL description, it is necessary to execute an operation simulation for a design description of a broader term at an operation level.

SUMMARY OF THE INVENTION

According to a first aspect of the present invention, there is provided an assertion description conversion device comprising: verification target identification unit parsing the syntax of a high-level assertion description described by a high-level assertion description language for verification of an inputted design description of a broader term to identify a verification target; design description searching unit searching a description on the verification target in a design description of a broader term; verification target description conversion unit converting the description of the verification target into a design description of a narrower term according to the design description of the narrower term corresponding to the description searched by the design description searching unit; verification content analysis unit for analyzing verification contents for the verification target described in the high-level assertion description; and verification content description conversion unit for converting the verification contents analyzed by the verification content analysis unit into the description format of a low-level assertion description language for verification of a design description of the narrower term.

According to a second aspect of the present invention, there is provided an assertion description conversion method comprising: parsing the syntax of a high-level assertion description described by a high-level assertion description language for verification of an inputted design description of a broader term to identify a verification target; searching a description on the verification target in a design description of a broader term; converting the description of the verification target into a design description of a narrower term according to the design description of the narrower term corresponding to the searched description; analyzing verification contents for the verification target described in the high-level assertion description; and converting the verification contents into the description format of a low-level assertion description language for verification of a design description of the narrower term.

According to a second aspect of the present invention, there is provided an assertion description conversion computer program product configured to store program instructions for execution on a computer system to perform: parsing the syntax of a high-level assertion description described by a high-level assertion description language for verification of an inputted design description of a broader term to identify a verification target; searching a description on the verification target in a design description of a broader term; converting the description of the verification target into a design description of a narrower term according to the design description of the narrower term corresponding to the searched description; analyzing verification contents for the verification target described in the high-level assertion description; and converting the verification contents into the description format of a low-level assertion description language for verification of a design description of the narrower term.

BRIEF DESCRIPTION OF THE DRAWINGS

FIG. 5 is a view for showing an example of a design description of an I/O cycle operation.

FIG. 6 is a view for showing correspondences between a design description at the transaction level and a design description at the I/O cycle operation level.

FIG. 14 is a view for showing an example of a statement table.

FIG. 15 is a view for showing an example of an assertion description for the RTL level generated by an assertion description conversion method of the second embodiment.

DETAILED DESCRIPTION OF THE EMBODIMENTS

Embodiments of the present invention will be described below with reference to the drawings.

First Embodiment

Figure 1:
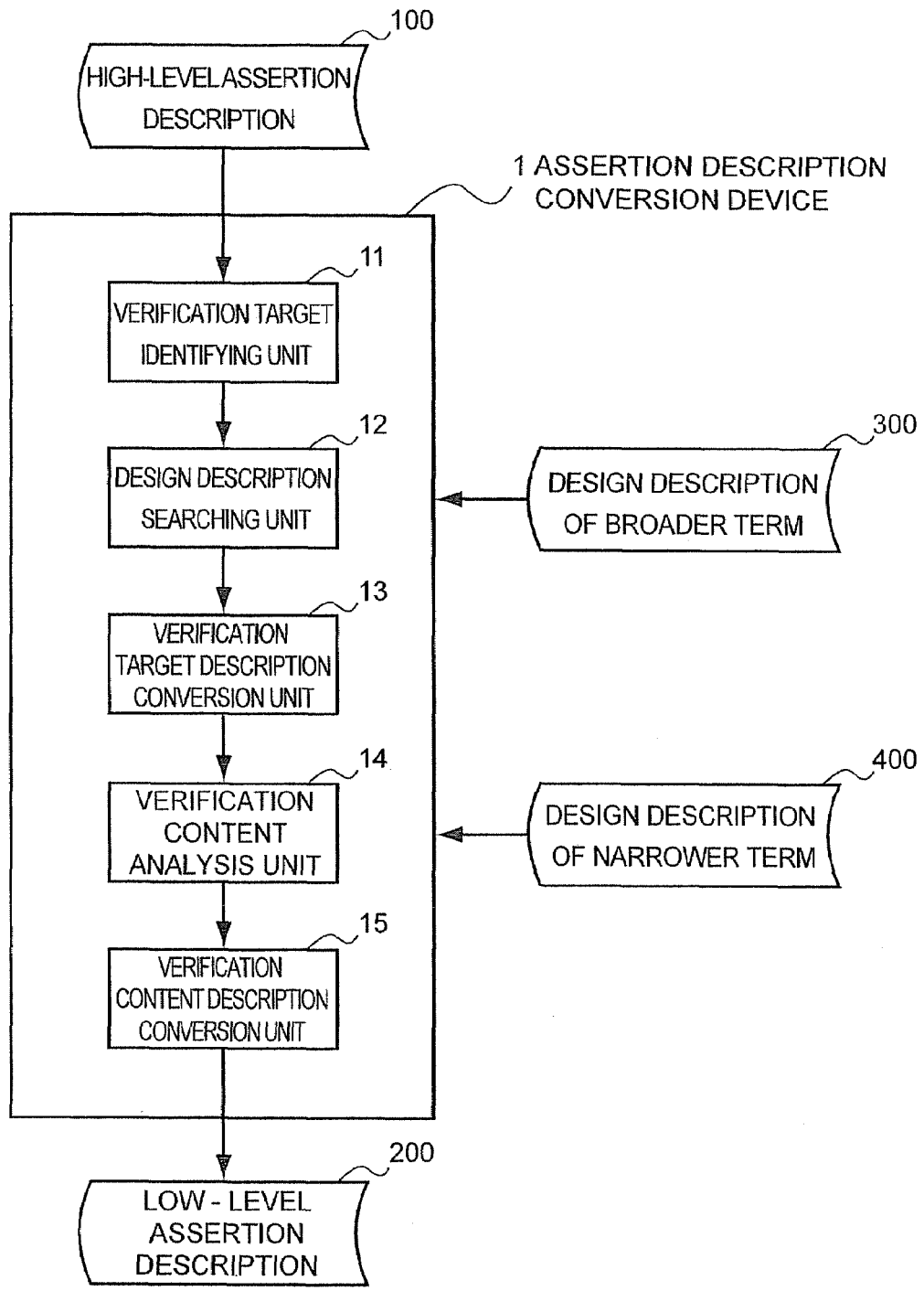
FIG. 1 is a block diagram for showing an example of the configuration of an assertion description conversion device according to a first embodiment of the present invention.

FIG. 1 is a block diagram for showing an example of the configuration of an assertion description conversion device according to a first embodiment of the present invention.

To the assertion description conversion device 1 of the present embodiment, inputted are: an high-level assertion description 100, described with a high-level assertion description language for verification of the design description of a broader term; a broader-term design description 300, described with a description language for design of broader terms; and a narrower-term design description 400 described by a description language for design of narrower terms. The assertion description conversion device 1 converts the high-level assertion description 100 into a low-level assertion description described with a low-level assertion description language for verification of the design description of a narrower term, and outputs the low-level assertion description thus converted as a low-level assertion description 200.

The assertion description conversion device 1 includes: a verification target identifying unit 11 for parsing the syntax of the high-level assertion description 100 in order to identify a verification target; a design description searching unit 12 for searching a description related to the identified verification target in the broader-term design description 300; a verification target description conversion unit 13 for converting the description in the searched broader-term design description 300 into a corresponding description in the narrower-term design description 400; a verification content analysis unit 14 for analyzing a verification content for the verification target described in the high-level assertion description 100; and a verification content description conversion unit 15 for converting the analyzed verification contents into the description format of the low-level assertion description language for verification of the design description of a narrower term.

Here, description will be given of a method of outputting, as the low-level assertion description 200, an assertion description at the I/O cycle operation level described with the SystemC using the assertion description conversion device 1 of the present embodiment with reference to FIGS. 2 to 8. In the description, an assertion description at the transaction level described with the SystemC is taken as an example of the high-level assertion description 100.

Figure 2:
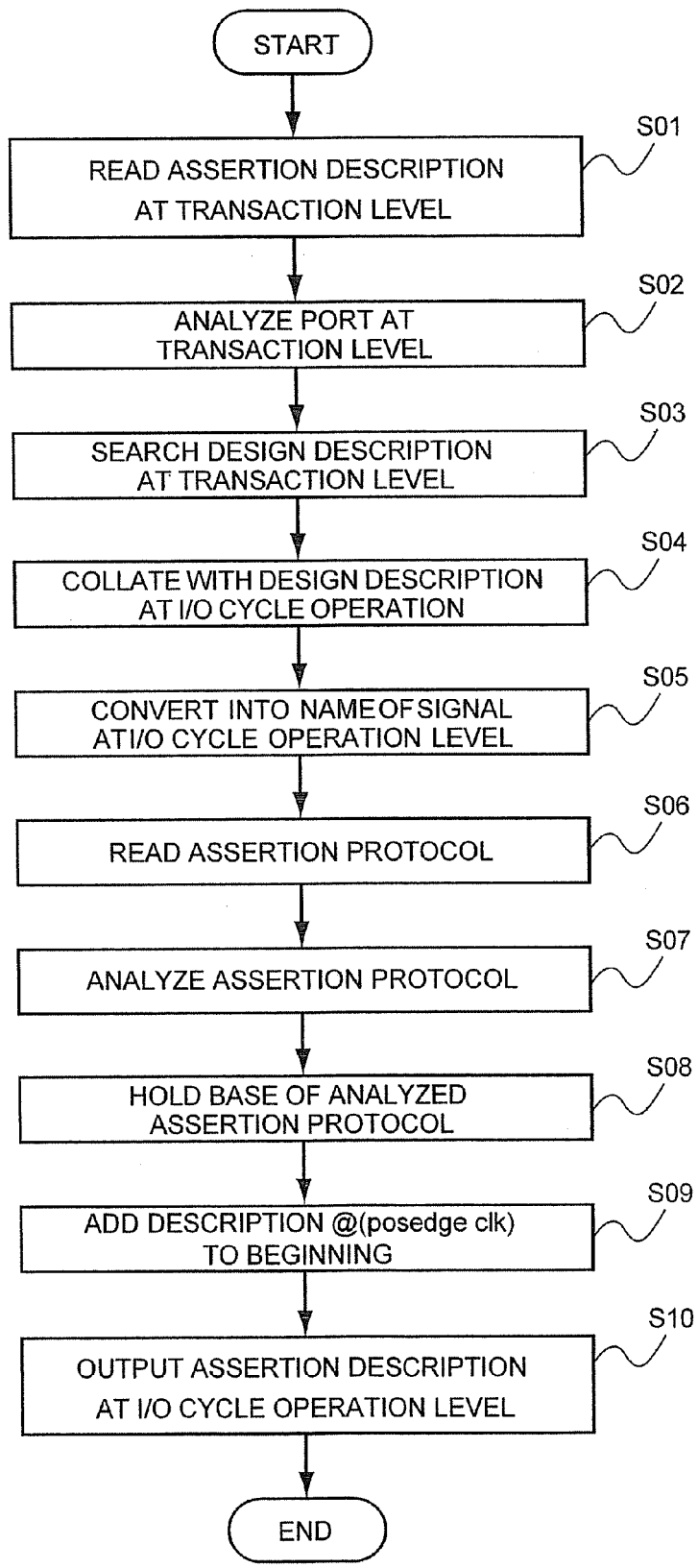
FIG. 2 is a flowchart for showing an example of the procedure of an assertion description conversion method according to the first embodiment of the present invention.

FIG. 2 is a flowchart showing the procedure of converting an assertion description at the transaction level into an assertion description at the I/O cycle operation level.

Figure 3:
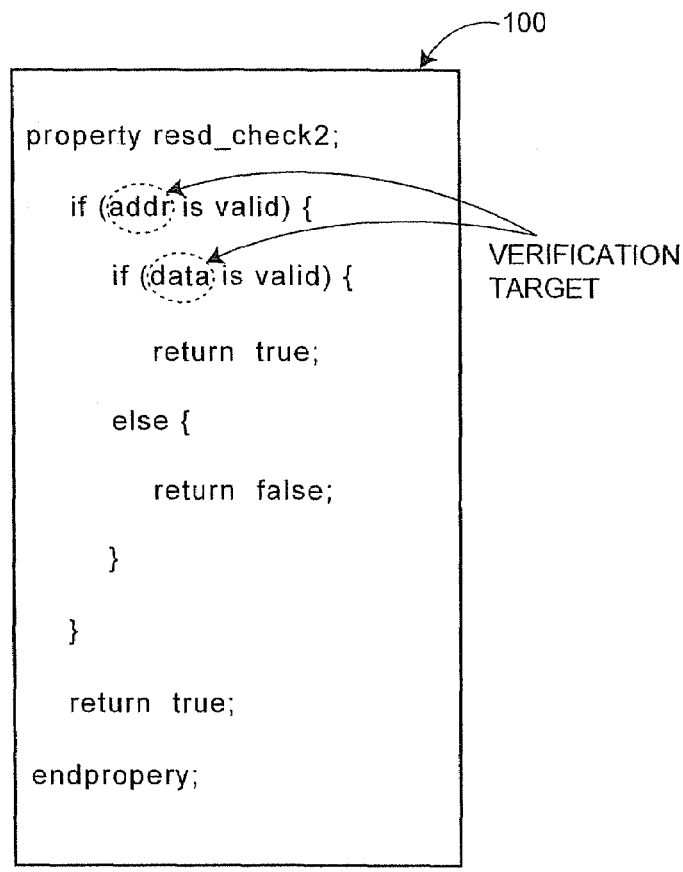
FIG. 3 is a view for showing an example of an assertion description at the transaction level.
Figure 4:
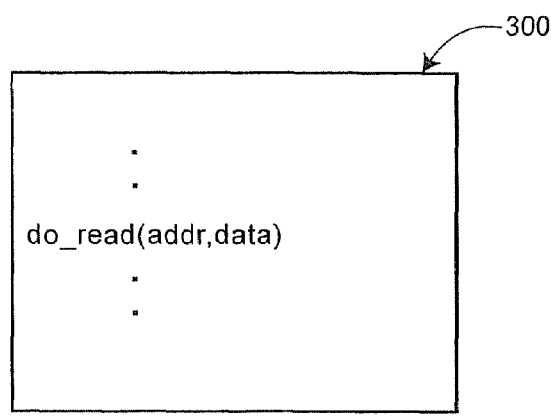
FIG. 4 is a view for showing an example of a design description at the transaction level.

Prior to conversion, the assertion description conversion device 1 reads an assertion description at the transaction level (Step S01). In FIG. 3, an example of the read assertion description at the transaction level is shown.

For this assertion description, the verification target identifying unit 11 performs an analysis on a port at the transaction level, the port being a target for verification (Step S02). In the assertion description shown in FIG. 3, "addr" and "data" are analyzed as the verification target ports.

Subsequently, the design description searching unit 12 searches a verification target description in a design description at the transaction level (Step S03). As a result, it is revealed that there is a verification target design description in the design description at the transaction level shown in FIG. 4.

Subsequently, the verification target description conversion unit 13 reads the design description at the I/O cycle operation level to collate, with the design description at the I/O operation level, the verification target design description at the transaction level, which is found through the searching by the design description searching unit 12 (Step S04). The design description at the I/O cycle operation level detected through the above-described collation is shown in FIG. 5.

Correspondences between the design description at the transaction level and the design description at the I/O cycle operation level are shown in waveforms in FIG. 6.

Here, FIG. 6A shows an operation at the transaction level, and FIG. 6B shows operation waveforms at the I/O cycle level operation level.

As a result of the collation by the verification target description conversion unit 13, it is revealed that a data signal "addr" and a control signal "ardy" at the I/O cycle operation level correspond to the port "addr" at the transaction level, and a data signal "data" and a control signal "drdy" at the I/O cycle operation level correspond to the port "data" at the transaction level.

Correspondences between the names of the ports in a design description at the transaction level and the names of the signals in a design description at the I/O cycle operation level are stored in the verification target description conversion unit 13, for example, in the form of a port signal correspondence table shown in FIG. 6, and the verification target description conversion unit 13 converts, according to the port signal correspondence table, the name of a port in the design description at the transaction level into the name of a signal in the design description at the I/O cycle operation level (Step S05).

Figure 7:
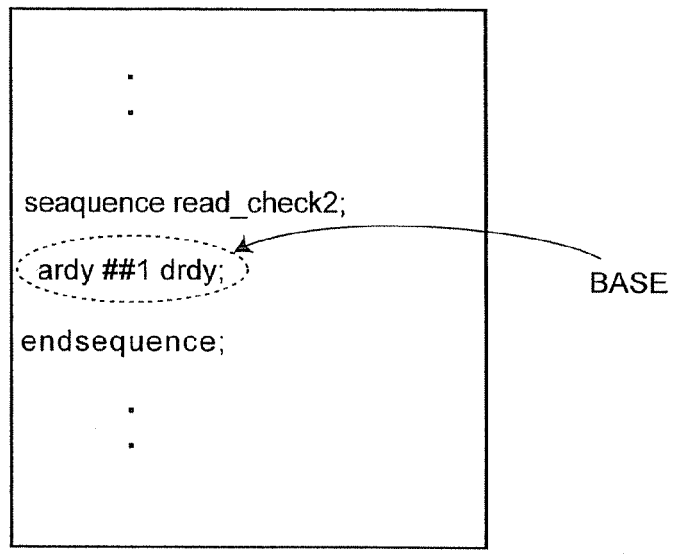
FIG. 7 is a view for showing an example of an assertion protocol.

The verification content analysis unit 14 reads the assertion protocol from an assertion description at the transaction level (Step S06). In FIG. 7, an example of a description of the assertion protocol is shown.

The verification content analysis unit 14 performs an analysis on the read assertion protocol to find out which statement is the base of the assertion protocol (Step S07). In the example shown in FIG. 7, the description of "ardy ##1 drdy" is the base of the assertion protocol.

The verification content analysis unit 14 holds the description of the body of the analyzed assertion protocol (Step S08).

Subsequently, the verification content description conversion unit 15 adds the description of "@(posedge clk)," indicating a clock synchronous operation, at the beginning of the description of the base of the assertion protocol held by the verification content analysis unit 14 (Step S09).

Further, the verification content description conversion unit 15 adds a property statement before the base of the assertion protocol to which the "@(posedge clk)" is added, and adds an endproperty statement after the base of the assertion protocol. The verification content description conversion unit 15 then outputs an assertion description at the I/O cycle operation level (Step S10).

Figure 8:
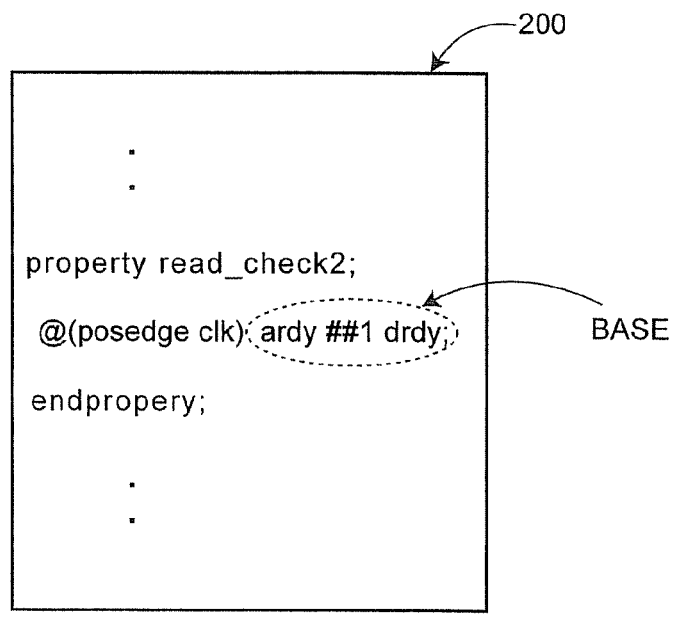
FIG. 8 is a view for showing an example of the assertion description of an I/O cycle operation generated by the assertion description conversion method of the first embodiment.

Thereafter, a series of conversion operations performed by the assertion description conversion device 1 are terminated. In FIG. 8, an example of the assertion description at the I/O cycle operation level outputted by the above-described conversion operation is shown.

According to the present embodiment, a low-level assertion description at the I/O cycle operation level is automatically generated using a high-level assertion description at the transaction level. Consequently, the assertion description at the I/O cycle operation level does not need to be manually created, and, hence, design efficiency of design verification can be enhanced.

Further, because the assertion description at the transaction level and the assertion description at the I/O cycle operation level are identical to each other, even when design levels are different, the uniformity of verification contents for the designs can be maintained.

Second Embodiment

Next, as another embodiment for the assertion description conversion, description will be given of a method in which an assertion description for a design description at the I/O operation level (an operation description) in a broader term of design is converted into an assertion description for a design description (RTL description) in a narrower term of design at the RTL.

Figures 9, 10:
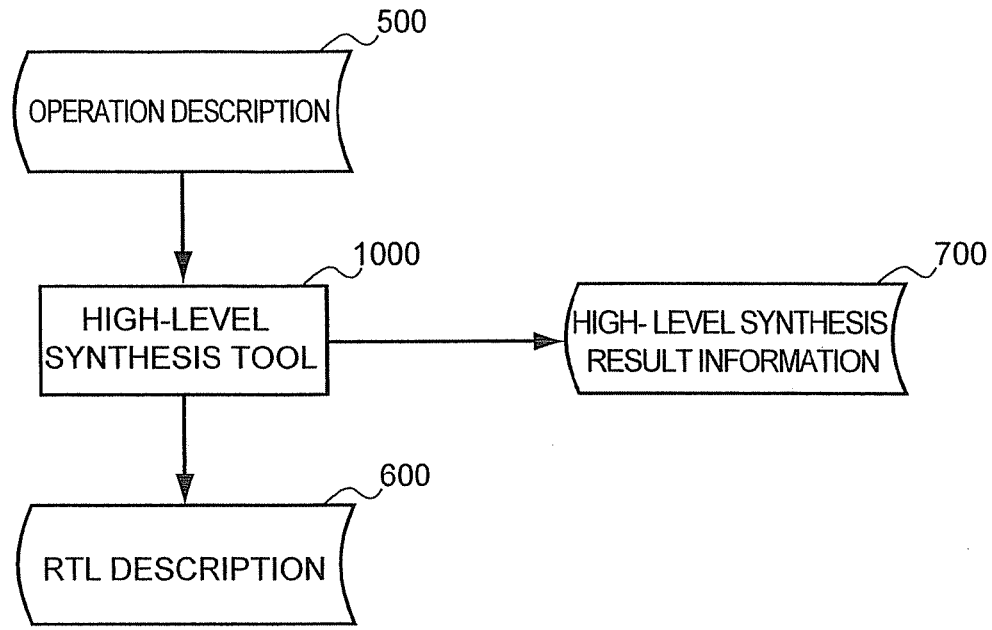
FIG. 9 is a flowchart of an RTL description generation by means of high-level synthesis.
FIG. 10 is a view for showing an example of information on a high-level synthesis result.

Here, it is assumed that an RTL description can be acquired by performing high-level synthesis of an operation description. FIG. 9 shows an outline of the design flow in which an RTL description is generated using an operation description with a high-level synthesis tool.

As shown in FIG. 9, having an operation description 500 as an input, a high-level synthesis tool 1000 performs a high-level synthesis process, and outputs an RTL description 600. At this time, the high-level synthesis tool 1000 also outputs high-level synthesis result information 700.

The high-level synthesis result information 700 includes latency information indicating the number of clocks required for the processing performed until an output signal for an input of a signal is outputted, and information such as a prediction of a chip area after synthesizing.

FIG. 10 shows an example of information which is described in the high-level synthesis result information 700. In this example, information on latency is described. In other words, the example shows that the processing performed between the times of the inputting of an input signal "in_accept" and the outputting of an output signal "out_ready" requires N clock cycles.

Next, referring to FIGS. 11 to 14, description will be given of a method in which an assertion description for an operation description is converted into an assertion description for an RTL description.

Figure 11:
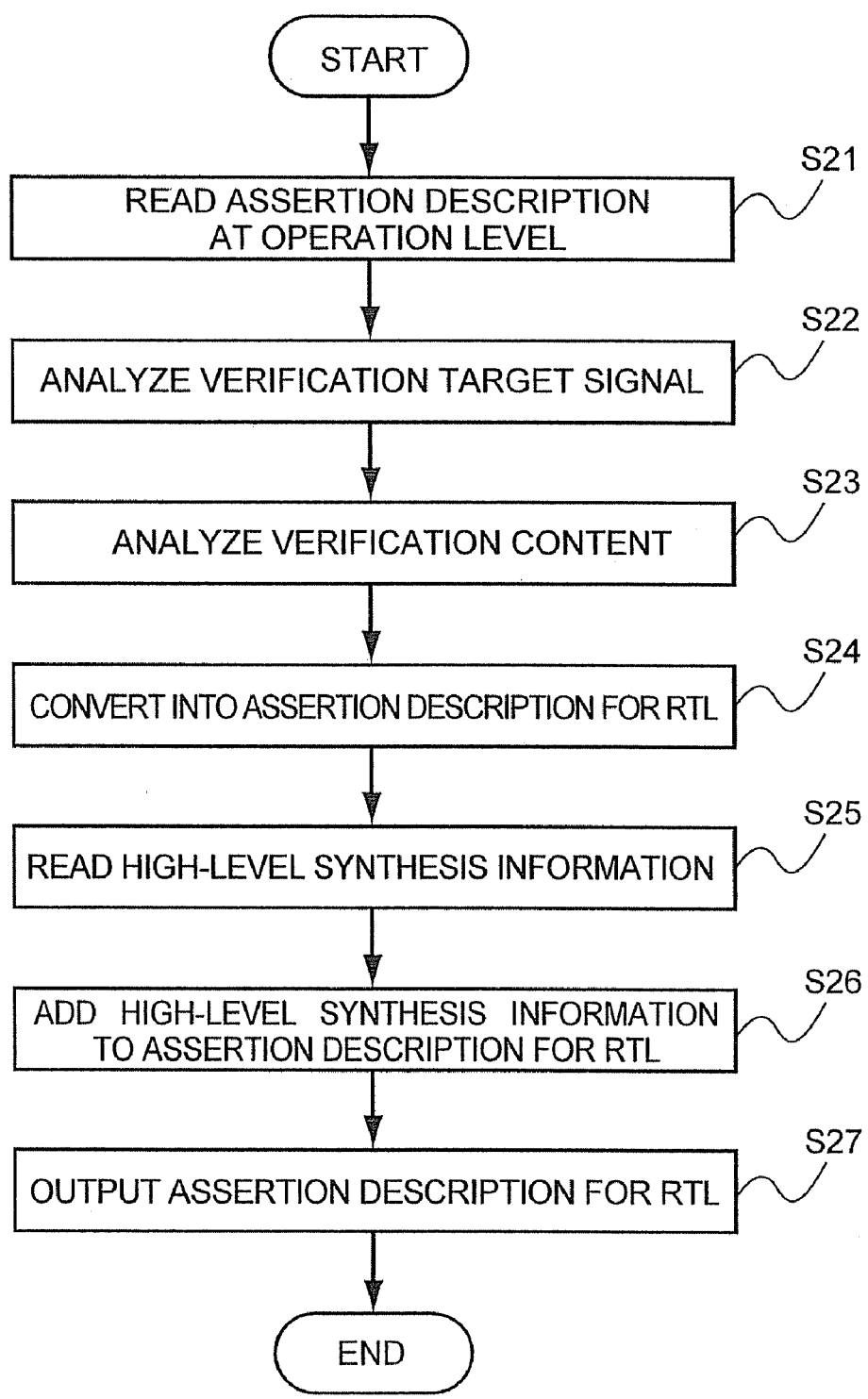
FIG. 11 is a flowchart for showing an example of the procedure of an assertion description conversion method according to a second embodiment of the present invention.

FIG. 11 is a flowchart showing the procedure in which an assertion description for an operation description (an assertion description at the operation level) is converted into an assertion description for an RTL description (an assertion description for RTL). Here, description is given on the assumption that an assertion description at the operation level is described with the SystemC, and that the described assertion description is converted into an assertion description for RTL described with the SVA.

Figure 12:
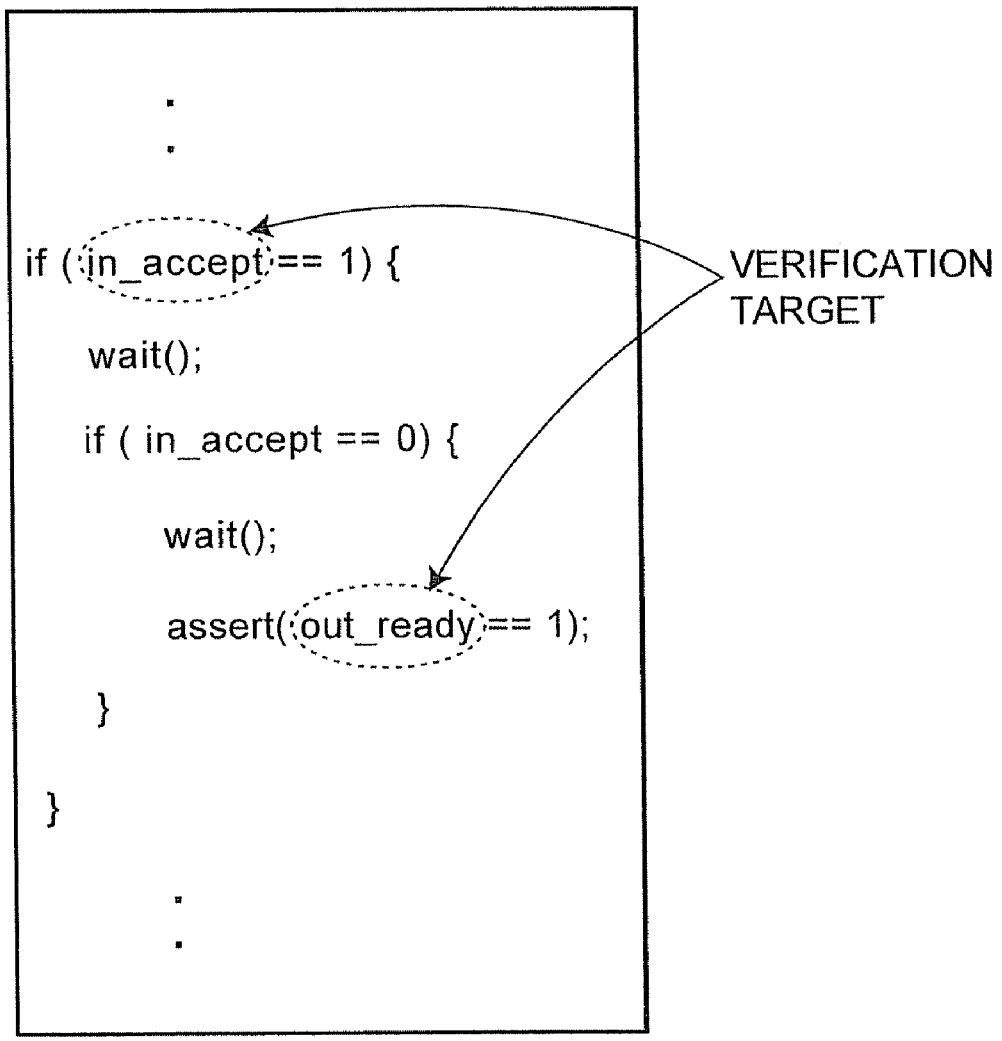
FIG. 12 is a view for showing an example of an assertion description at the operation level.

After starting conversion, an assertion description at the operation level is read (Step S21). FIG. 12 shows an example of the read assertion description at the operation level.

For this assertion description, signals being the targets for verification are analyzed (Step S22). In the assertion description shown in FIG. 12, as a result of the analysis, "in_accept" and "out_ready" are given to be the ports for verification targets.

Figure 13:
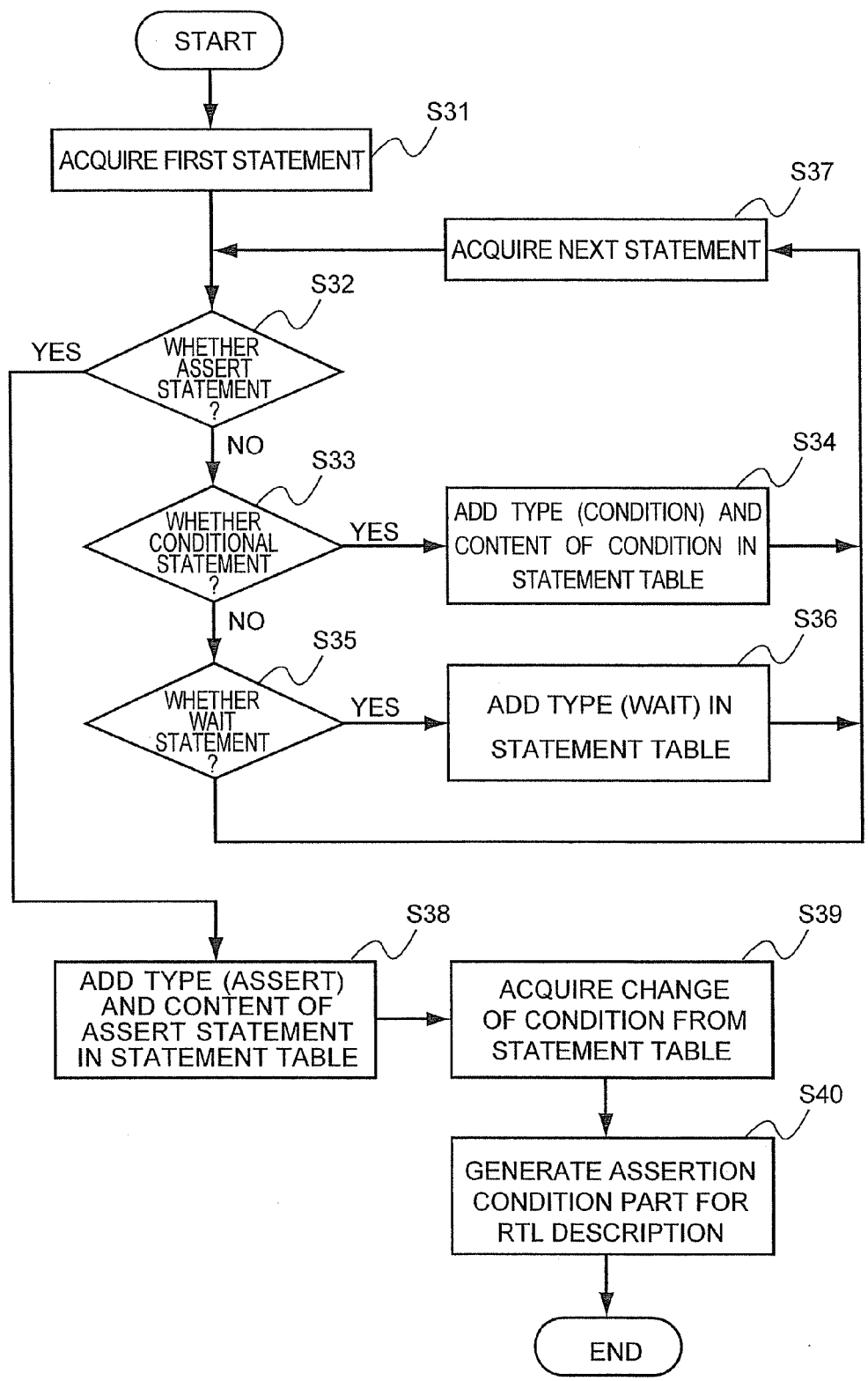
FIG. 13 is a flowchart for showing an example of the procedure of analyzing contents of an assertion description.

Subsequently, for the assertion description shown in FIG. 12, a verification content analysis is performed (Step S23). FIG. 13 shows the detailed flow of the verification content analysis.

After the flow in FIG. 13 starts, first, the first statement of the beginning of an assertion description is acquired (Step S31).

Subsequently, whether the first statement is an assert statement is checked (Step S32). In the example of the assertion description shown in FIG. 12, the result of the above-described first check is to be NO since the first statement is not an assert statement.

When the first check gives NO, then, whether the first statement is a conditional statement is checked (Step S33).

When the above-described second check gives YES, the first statement is described in a statement table in which the statement is described in terms of the type of the sentence and the contents of the description (Step S34).

In the example of the assertion description shown in FIG. 12, the second check gives YES since the first statement is a conditional statement starting with "if". Accordingly, "condition" is described in the field of type of the statement table, and "in_accept==1" is described in the field of content of the statement table. FIG. 14 shows an example of this statement table.

After the describing in the statement table is terminated, a second statement is acquired (Step S37).

For the acquired second statement, whether this statement is an assert statement is checked by returning to Step S32. In the example of the assertion description shown in FIG. 12, since the second statement is not an assert statement, the processing further goes to Step 33, and whether the second statement is a conditional statement is checked. The second check for the second statement also gives NO, the processing goes to the next step.

In the next step, whether the second statement is a wait statement is checked (Step S35). When this third check gives YES, the type of the sentence of the second statement is described in the statement table (Step S36).

In the example of the assertion description shown in FIG. 12, "wait" is described in the field of kind of the statement table since the third check gives YES. Incidentally, the field of content of the statement table is left blank.

When the describing for the statement table is terminated, the third statement is acquired by returning to Step S37.

In this manner, the processing from Steps S32 to S37 are repeated until the check on whether the statement in Step S32 is an assert statement gives YES.

When the check in Step S32 gives YES, "assert" is described in the field of kind of the statement table, and the contents of the assert statement are described in the field of content of the statement table (Step S38). In the example of the assertion description shown in FIG. 12, "out_ready==1" is described in the field of content of the statement table.

At this time, the generation of the statement table is completed. Subsequently, a change of a condition is acquired from the statement table (Step S39).

From the statement table shown in FIG. 14, "1->0" is acquired as a change of the condition of "in_accept."

Finally, according to the change of the condition, an assertion condition part for RTL description is generated (Step S40). For the example of the assertion description shown in FIG. 12, "$fell(in_accept)" is generated as the assertion condition part for RTL description. Thereafter, the analysis flow of verification contents for the assertion description is completed.

The assertion description at the operation level is converted, by returning to the flow shown in FIG. 11, into an assertion description for RTL using a result of the analysis in Step S23 (Step S24). At this time, in the format of the SVA, the description format is represented as "<condition>|-><delay><content>."

Accordingly, for the assertion description at the operation level shown in FIG. 12, the description of "$fell(in_accept) |-><delay>out_ready==1" is generated as the assertion description for RTL. Here, <delay> is the latency between the times of the inputting of an input signal "in_accept" and the outputting of an output signal "out_ready".

To acquire information on this latency, high-level synthesis information is read (Step S25). Information on latency acquired from the high-level synthesis information is then added to the assertion description for RTL (Step S26).

At this time, when the high-level synthesis information is represented as in the example shown in FIG. 10, the latency between the times of the inputting of an input signal "in_accept" and the outputting of an output signal "out_ready" is "N clock cycles." Accordingly, <delay> in the assertion description for RTL is described as "##N" using the format of the SVA.

The assertion description for RTL thus converted is outputted (Step S27), and the processing included in this flow is terminated.

FIG. 15 shows an example of the outputted assertion description for RTL. In other words, the assertion description at the operation level shown in FIG. 12 is converted into an assertion description for RTL represented as "$fell (in_accept) |->##N out_ready==1."

According to the second embodiment, delay information necessary for generating an assertion description for RTL is acquired from high-level synthesis information outputted at the time of high-level synthesizing, so that simulation is not necessary to be performed, and time required for generating the assertion description for RTL can be shortened.

According to the above-mentioned embodiments, an assertion description conversion device and a method by which an assertion description for a design description of a narrower term can be automatically generated using an assertion description for a design description of a broader term are obtainable.

Moreover, the present invention can be carried out as a computer program product which records a program for executing the assertion description conversion method of the present embodiments to a system including a computer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An assertion description conversion device comprising:
verification target identification unit parsing the syntax of a high-level assertion description described by a high-level assertion description language for verification of an inputted design description of a broader term to identify a verification target;
design description searching unit searching a description on the verification target in a design description of a broader term;
verification target description conversion unit converting the description of the verification target into a design description of a narrower term according to the design description of the narrower term corresponding to the description searched by the design description searching unit;
verification content analysis unit for analyzing verification contents for the verification target described in the high-level assertion description;
verification content description conversion unit for converting the verification contents analyzed by the verification content analysis unit into the description format of a low-level assertion description language for verification of a design description of the narrower term; and
wherein, in the verification target description conversion unit, when converting the description of the verification target description into the design description of the narrower term, a description for timing adjustment is added according to synthesis result information at the time when synthesizing the design description of the narrower term according to the design description of the broader term.

2. The assertion description conversion device according to claim 1, wherein, in the verification target description conversion unit, the verification target description is converted into a design description of the narrower term using a design description cross-reference in which correspondences between the design description of the broader term and the design description of the narrower term are described.

3. The assertion description conversion device according to claim 1, wherein, in the verification target description conversion unit, the verification target description is converted into a design description of the narrower term using a description language cross-reference in which correspondences between the high-level assertion description language and the low-level assertion description language are described.

4. The assertion description conversion device according to claim 1, wherein the high-level assertion description is an assertion description of the transaction level and the low-level assertion description is an assertion description of the I/O cycle operation level.

5. The assertion description conversion device according to claim 1, wherein the high-level assertion description is an assertion description of the I/O cycle operation level and the low-level assertion description is an assertion description for RTL.

6. An assertion description conversion method comprising:
employing a processor executing computer executable instructions stored on a computer readable medium to implement the following acts:
parsing the syntax of a high-level assertion description described by a high-level assertion description language for verification of an inputted design description of a broader term to identify a verification target;
searching a description on the verification target in a design description of a broader term;
converting the description of the verification target into a design description of a narrower term according to the design description of the narrower term corresponding to the searched description;
analyzing verification contents for the verification target described in the high-level assertion description;
converting the verification contents into the description format of a low-level assertion description language for verification of a design description of the narrower term; and
wherein, in the verification target description conversion step, when converting the description of the verification target description into the design description of the narrower term, a description for timing adjustment is added according to synthesis result information at the time when synthesizing the design description of the narrower term according to the design description of the broader term.

7. The assertion description conversion method according to claim 6, wherein, in the verification target description conversion step, the verification target description is converted into a design description of the narrower term using a design description cross-reference in which correspondences between the design description of the broader term and the design description of the narrower term are described.

8. The assertion description conversion method according to claim 6, wherein, in the verification target description conversion step, the verification target description is converted into a design description of the narrower term using a description language cross-reference in which 10 correspondences between the high-level assertion description language and the low-level assertion description language are described.

9. The assertion description conversion method according to claim 6, Wherein the high-level assertion description is an assertion description of the transaction level and the low-level assertion description is an assertion description of the I/O cycle operation level.

10. The assertion description conversion method according to claim 6, Wherein the high-level assertion description is an assertion description of the I/O cycle operation level and the low-level assertion description is an assertion description for RTL.

11. An assertion description conversion computer program product configured to store program instructions for execution on a computer system to perform:
parsing the syntax of a high-level assertion description described by a high-level assertion description language for verification of an inputted design description of a broader term to identify a verification target;
searching a description on the verification target in a design description of a broader term;
converting the description of the verification target into a design description of a narrower term according to the design description of the narrower term corresponding to the searched description;
analyzing verification contents for the verification target described in the high-level assertion description;
converting the verification contents into the description format of a low-level assertion description language for verification of a design description of the narrower term; and
wherein, in the verification target description conversion instruction, when converting the description of the verification target description into the design description of the narrower term, a description for timing adjustment is added according to synthesis result information at the time when synthesizing the design description of the narrower term according to the design description of the broader term.

12. The computer program product according to claim 11, wherein, in the verification target description conversion instruction, the verification target description is converted into a design description of the narrower term using a design description cross-reference in which correspondences between the design description of the broader term and the design description of the narrower term are described.

13. The computer program product according to claim 11, wherein, in the verification target description conversion instruction, the verification target description is converted into a design description of the narrower term using a description language cross-reference in which correspondences between the high-level assertion description language and the low-level assertion description language are described.

14. The computer program product according to claim 11, wherein the high-level assertion description is an assertion description of the transaction level and the low-level assertion description is an assertion description of the I/O cycle operation level.

* * * * *